(12) United States Patent  
Yang et al.

(10) Patent No.: US 8,837,542 B1  
(45) Date of Patent: Sep. 16, 2014

(54) LASER DIODE DRIVING APPARATUS FOR OPTICAL COMMUNICATION

(71) Applicant: Electronics and Telecommunications Research Institute, Daejeon-si (KR)

(72) Inventors: Choong-Reol Yang, Daejeon-si (KR); Sang-Soo Lee, Daejeon-si (KR)

(73) Assignee: Electronics and Telecommunications Research Institute, Daejeon-Si (KR)

( * ) Notice: Subject to any disclaimer, the term of this patent is extended or adjusted under 35 U.S.C. 154(b) by 0 days.

(21) Appl. No.: 14/080,297

(22) Filed: Nov. 14, 2013

(30) Foreign Application Priority Data

Mar. 27, 2013 (KR) .................. 10-2013-0032991

(51) Int. Cl.
*H01S 3/00* (2006.01)
*H01S 5/06* (2006.01)

(52) U.S. Cl.
CPC .................................. *H01S 5/06* (2013.01)
USPC ............... 372/38.02; 372/38.07; 372/29.015; 372/29.01

(58) Field of Classification Search
USPC .................... 372/38.02, 38.07, 29.015, 29.01
See application file for complete search history.

(56) References Cited

U.S. PATENT DOCUMENTS

| 6,272,160 | B1 | 8/2001 | Stronczer | |
| 7,728,630 | B1* | 6/2010 | Ren et al. | 326/86 |
| 2007/0153849 | A1* | 7/2007 | Koren et al. | 372/38.02 |

OTHER PUBLICATIONS

R. Tao et al., "Low power 4×5-Gb/s VCSEL Driver Array in 0.13?m CMOS" Electronics, Circuits, and Systems, 2009. ICECS 2009. 16th IEEE International Conference on, pp. 816-819, Dec. 13-16, 2009.
W.S. Oh et al., "Design of a 4-Channel 10-Gb/s CMOS VCSEL Driver Array" Optical Internet, 2008. COIN 2008. 7th International Conference on, pp. 1-2, Oct. 14-16, 2008.
Anh Tuan Phan et al., "Low power 10 Gbit/s VCSEL driver for optical interconnect" Electronics Letters, vol. 39, Issue. 24, pp. 1743-1744, Nov. 27, 2003.
Won-Seok Oh et al., "A 4-Ch 10-Gb/s CMOS VCSEL Driver Array with Adaptive Optical Power Control" Advanced Communication Technology (ICACT), 2010 The 12th International Conference on, pp. 826-829, Feb. 7-10, 2010.
Jean-Philippe Thibodeau et al., "24mW 2.5Gb/s VCSEL Driver in 0.18um CMOS" Biophotonics/Optical Interconnects and VLSI Photonics/WBM Microcavities, 2004 Digest of the LEOS Summer Topical Meetings, pp. 61-62, Jun. 28-30, 2004.
Choong-reol Yang et al., "Implementation and Design of Core Chip for 3.1 Gb/s VSCEL Driver in 0.18μCMOS" Published Paper, The Journal of Korea Information and Communications Society (J-KICS), vol. 38, No. 1, Jan. 2013.

* cited by examiner

*Primary Examiner* — Kinam Park
(74) *Attorney, Agent, or Firm* — Rabin & Berdo P.C.

(57) ABSTRACT

A laser diode driving apparatus for optical communication is provided so as to prepare a low-price and low-power optical transmission and reception apparatus by realizing the high performance laser diode driving apparatus for optical communication with a structure appropriate for a multichannel array that can easily and effectively provide stable bandwidths and high gains of the optical communication laser diode at a transmission end of the optical transmission and reception apparatus.

10 Claims, 10 Drawing Sheets

LASER DIODE DRIVING APPARATUS FOR OPTICAL COMMUNICATION

CROSS-REFERENCE TO RELATED APPLICATION

This application claims the benefit under 35 U.S.C. §119(a) of Korean Patent Application No. 10-2013-0032991, filed on Mar. 27, 2013, the entire disclosure of which is incorporated herein by reference for all purposes.

BACKGROUND

1. Field

The following description relates to a laser diode driving apparatus, more particularly to, a laser diode driving apparatus for optical communication.

2. Description of the Related Art

A future laser diode driving apparatus for optical communication should reduce energy consumption to 50 to 75%, and a future high-performance optical communication system requires an optical input/output (I/O) that satisfies several terabytes bandwidths requirements having high energy efficiency. In order to support a terabyte optical input/output (I/O) capacity, a form factor should be reduced so that a port density can be greatly increased. If the port density is increased, the price per port can be greatly reduced.

A short-term optical input/output solution is to combine optical and electric components to a package, and a long-term optical input/output solution is to integrate optical elements directly to CMOS to increase the bandwidth and energy efficiency. CMOS consumes very small energy, and the energy consumption tends to decrease continuously. Therefore, when high speed processing or calculations are required, the energy efficiency is high.

One of key issues of the short-term optical input/output (I/O) solution is to integrate a CMOS integrated transceiver circuit, a discrete detector array, and a waveguide by using a commercial package. Fundamentally, in order to achieve the cost reduction, which is one of the biggest obstacles to commercialize Wavelength Division Multiplexed Passive Optical Network (WDM-PON), a CMOS photonics technique is applied so that an optical transmission and reception module of an Optical Line Terminal (OLT) apparatus is made into a single chip to reduce a cost, a size, and power consumption, and to decrease a line card production cost.

Therefore, the inventors of the present invention have been studied on the high performance driver with a structure appropriate for a multichannel array that can easily and effectively provide stable bandwidths and high gains of the optical communication laser diode at a transmission end of the optical transmission and reception apparatus. An example relating to the laser diode driving circuit is as disclosed in U.S. Pat. No. 6,272,160 (Aug. 7, 2001).

SUMMARY

Accordingly, the present invention has been made in view of the above, and has an object to provide a high performance laser diode driving apparatus for optical communication with a structure appropriate for a multichannel array that can easily and effectively provide stable bandwidths and high gains of the optical communication laser diode at a transmission end of the optical transmission and reception apparatus.

In one general aspect of the present invention to achieve the object described above, a laser diode driving apparatus for optical communication that includes a pre-driver; and a main driver is provided. In the laser diode driving apparatus for optical communication, the pre-driver includes a first differential amplifying unit that has a plurality of cascode amplifiers $CA_1$ and $CA_2$, in which drains of pnp-type transistors $M_1$ and $M_2$ and npn-type transistors $M_3$ and $M_4$ are commonly connected to a plurality of output terminals $V_{out1}$ and $V_{out2}$, sources of the pnp-type transistors $M_1$ and $M_2$ are connected to a power supply voltage terminal $V_{DD}$, sources of the npn-type transistors $M_3$ and $M_4$ are commonly connected to a ground terminal $V_{SS}$, gates of the pnp-type transistors $M_1$ and $M_2$ are connected to a DC bias voltage terminal $V_{b2}$, gates of the npn-type transistors $M_3$ and $M_4$ are respectively connected to a plurality of low voltage differential signal input terminals $V_{in1}$ and $V_{in2}$, and a plurality of differential amplified signals are output to the main driver.

In another general aspect of the present invention, the pre-driver further includes a plurality of active loads respectively connected between the gates of the pnp-type transistors $M_1$ and $M_2$ of the cascode amplifiers $CA_1$ and $CA_2$ and the DC bias voltage terminal $V_{b2}$, and configured to apply currents insensitive to operating point changes to the gates of the pnp-type transistors $M_1$ and $M_2$.

In another general aspect of the present invention, the active loads are resistors $R_{L1}$.

In another general aspect of the present invention, the pre-driver further includes a gain controller that is commonly connected to between the sources of the npn-type transistors $M_3$ and $M_4$ of the plurality of cascode amplifiers $CA_1$ and $CA_2$ and the ground terminal $V_{SS}$ so that a common mode voltage gain becomes 0 by making output resistance to be infinite.

In another general aspect of the present invention, the gain controller is provided with an npn-type transistor $M_5$ in which a drain is commonly connected to sources of the npn-type transistors $M_3$ and $M_4$ of the plurality of cascode amplifiers $CA_1$ and $CA_2$, a source is connected to the ground terminal $V_{SS}$, and a gate is connected to a DC bias voltage terminal $V_{b1}$.

In another general aspect of the present invention, the main driver further includes a second differential amplifying unit that includes a plurality of npn-type transistors $M_6$ and $M_7$ in which drains are respectively connected to the power supply voltage terminal $V_{DD}$ through the plurality of resistors $R_{L2}$, sources are commonly connected to the ground terminal $V_{SS}$, gates are respectively connected to the plurality of output terminals $V_{out1}$ and $V_{out2}$ of the pre-driver, and a plurality of differential amplified signals are output between the drains and the resistors $R_{L2}$, and an output controller including a cascode amplifier $CA_3$ that has two npn-type transistor $M_8$ and $M_9$, in which the drain of the npn-type transistor $M_8$ is connected to the power supply voltage terminal $V_{DD}$, a source of the npn-type transistor $M_9$ is connected to the ground terminal $V_{SS}$, a source of the npn-type transistor $M_8$ and a drain of the npn-type transistor $M_9$ are commonly connected to a single output terminal $V_{out3}$, and a plurality of differential amplified signals output from the second differential amplifying unit are applied to gates of the two npn-type transistors $M_8$ and $M_9$.

In another general aspect of the present invention, the main driver further includes a compensation controller that automatically controls and compensates for changes by temperature-dependent characteristics of currents output to a laser diode through the single output terminal $V_{out3}$.

In another general aspect of the present invention, wherein the compensation controller includes a plurality of npn-type transistors $M_{10}$ and $M_{11}$, in which gates of the plurality of npn-type transistors $M_{10}$ and $M_{11}$ are commonly connected to a modulated current terminal $I_{mod}$, sources of the plurality of npn-type transistor $M_{10}$ and $M_{11}$ are respectively connected to the ground terminal $V_{SS}$, a drain of the npn-type transistor $M_{10}$ is connected to the modulated current terminal $I_{mod}$, a drain of the npn-type transistor $M_{11}$ is commonly connected to the sources of the plurality of npn-type transistor $M_6$ and $M_7$ of the second differential amplifying unit.

In another general aspect of the present invention, the main driver further includes a power controller that configures a range of an output voltage output to the laser diode through the single output terminal $V_{out3}$.

In another general aspect of the present invention, the power controller includes a plurality of npn-type transistors $M_{12}$ and $M_{13}$, in which gates of the plurality of npn-type transistors $M_{12}$ and $M_{13}$ are commonly connected to the bias current terminal $I_{bias}$ sources of the plurality of npn-type transistors $M_{12}$ and $M_{13}$ each are connected to the ground terminal $V_{SS}$, a drain of the npn-type transistor $M_{12}$ is connected between the source of the npn-type transistor $M_8$ of the cascode amplifier $CA_3$ and the single output terminal $V_{out3}$, and a drain of the other npn-type transistor $M_{13}$ is connected to the bias current terminal $I_{bias}$.

The present invention has an effect of providing a low-price and low-power optical transmission and reception apparatus by realizing the high performance laser diode driving apparatus for optical communication with a structure appropriate for a multichannel array that can easily and effectively provide stable bandwidths and high gains of the optical communication laser diode at a transmission end of the optical transmission and reception apparatus.

DETAILED DESCRIPTION

Hereinafter, preferred embodiments of the present invention will be described with reference to the drawings so that the present invention could have been easily understood and realized by those skilled in the art.

In the following description of the present invention, a detailed description of known functions and configurations incorporated herein will be omitted when it may make the subject matter of the present invention rather unclear.

Also, the terms described below are defined in consideration of the functions of the present invention, and may differ in accordance with a user's or operator's intention or custom, and the definition of such wordings should be made based on the contents throughout the entire description of the present invention.

Vertical Cavity Surface Emitting Laser (VCSEL) is a laser for a short range single or high density link, which can provide a high integration with a low price and a low electric power, using a commercial CMOS technology in a low price and short range application in a several gigabyte data speed. Therefore, the VCSEL has been gaining great interest since the VCSEL is appropriate for realizing a VCSEL driver technology.

Since optical power of the vertical cavity surface emitting laser (VCSEL) decreases depending on characteristics of incoming electric current according to time and temperature, a driving circuit should be prepared so that a modulated current and a bias current are controlled at the same time and deterioration of an optical output data stream influenced by temperature is compensated.

Figure 1:
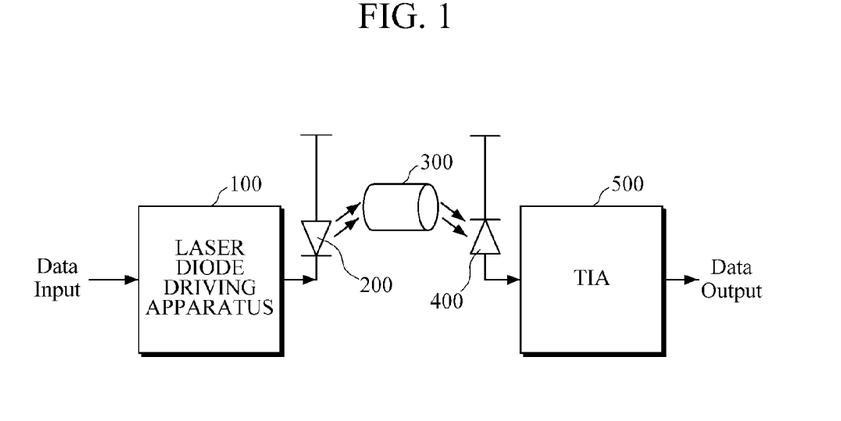
FIG. 1 is a diagram illustrating a high speed data transmission and reception structure.

FIG. 1 is a diagram illustrating a high speed data transmission and reception structure. An output of an optical communication laser diode 200 such as a VCSEL driven by a laser diode driving apparatus 100 for optical communication at a transmission end is transmitted through a MultiMode Fiber (MMF) 300, detected by a photodiode 400 at a reception end, and received through a TransImpedance Amplifier (TIA) 500.

Figure 2:
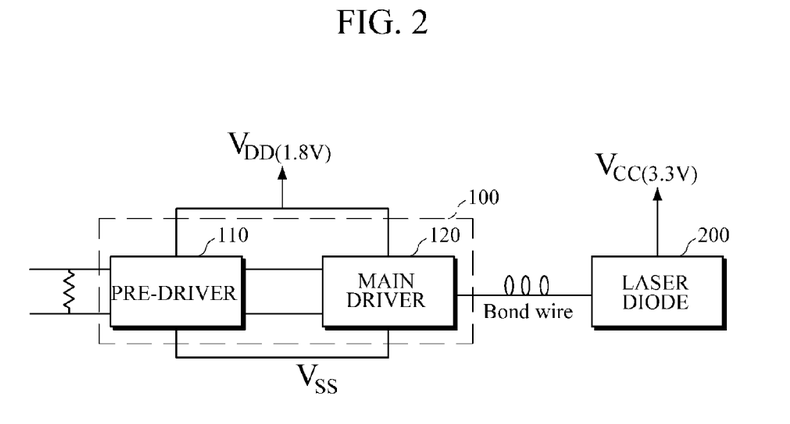
FIG. 2 is a diagram schematically illustrating a laser diode driving apparatus for optical communication according to an embodiment of the present invention.

FIG. 2 is a diagram schematically illustrating a laser diode driving apparatus for optical communication according to an embodiment of the present invention. As illustrated in FIG. 2, the laser diode driving apparatus 100 for optical communication includes a pre-driver 110 and a main driver 120.

The pre-driver 110 is prepared at the front end of the main driver 120, and improves gains and bandwidths of input voltages input to the laser diode driving apparatus 100 for optical transmission to perform a differential amplification output.

The laser diode driving apparatus for optical communication has a close correlation between great electric current driving and high speed operation. If a large output transistor is designed so as to drive a large output electric current, a large parasitic capacitance is generated, and eventually a bandwidth is limited. Therefore, the pre-driver 110 is prepared to improve this.

The main driver 120 is prepared at the rear end of the pre-driver 110, and improves gains and bandwidths of a single-ended output voltage output from the laser diode driving apparatus 100 for optical transmission to the laser diode 200.

The main driver 120 provides the laser diode 200 with a sufficient electric current, and the main driver 120 is prepared so that a modulated current and a bias current (current mirror) can be controlled and an average transmission optical power and an extinction ratio can be maintained since optical power of a laser diode changes according to characteristics of an electric current input to the laser diode (or decreases according to time and temperature).

Figure 3:
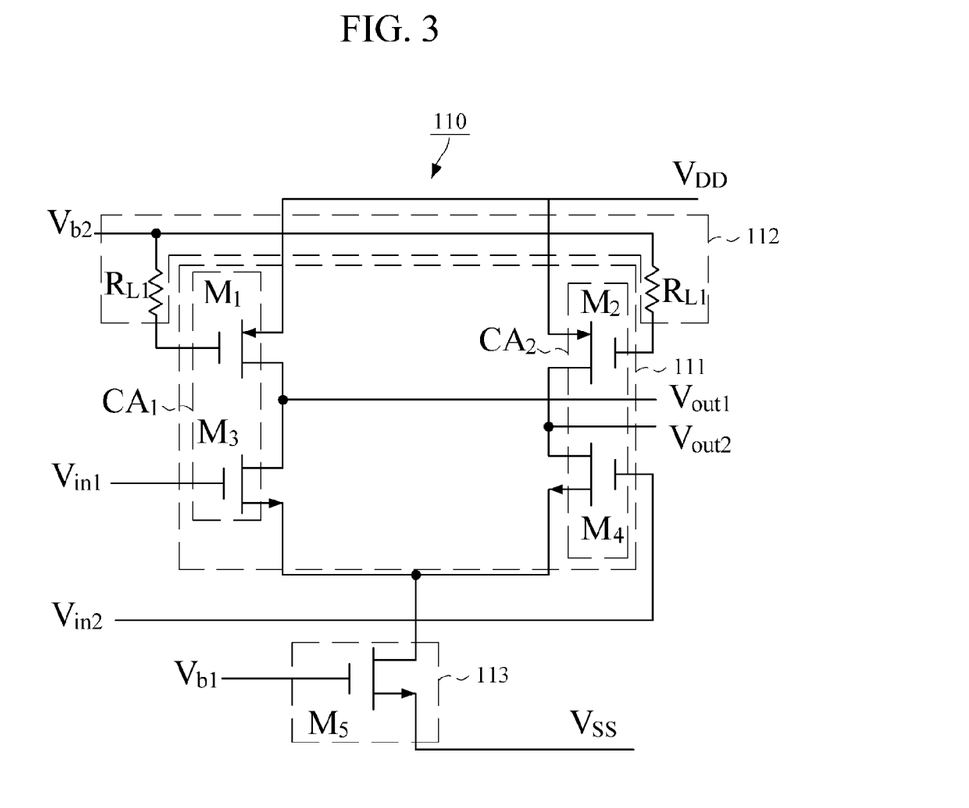
FIG. 3 is a circuit diagram illustrating a configuration of a pre-driver of a laser diode driving apparatus for optical communication according to an embodiment of the present invention.

FIG. 3 is a circuit diagram illustrating a configuration of a pre-driver of a laser diode driving apparatus for optical communication according to an embodiment of the present invention. As illustrated in FIG. 3, the pre-driver 110 according to the embodiment of the present invention includes a first differential amplifying unit 111.

The first differential amplifying unit 111 includes a plurality of cascode amplifiers $CA_1$ and $CA_2$, the cascode amplifier $CA_1$ includes a pnp-type transistor $M_1$ and an npn-type transistor $M_3$, and the cascode amplifier $CA_2$ includes a pnp-type transistor $M_2$ and an npn-type transistor $M_4$.

Drains of the pnp-type transistors $M_1$ and $M_2$ and the npn-type transistors $M_3$ and $M_4$ are commonly connected to a plurality of output terminals $V_{out1}$ and $V_{out2}$, respectively, sources of the pnp-type transistors $M_1$ and $M_2$ are connected to a power supply voltage terminal $V_{DD}$, sources of the npn-type transistors $M_3$ and $M_4$ are commonly connected to the ground terminal $V_{SS}$, gates of the pnp-type transistors $M_1$ and $M_2$ are connected to a DC bias voltage terminal $V_{b2}$, and gates of the npn-type transistors $M_3$ and $M_4$ are connected to a plurality of low voltage differential signal input terminals $V_{in1}$ and $V_{in2}$, respectively, so that a plurality of differential amplified signals are output to the main driver 120.

If the DC bias voltage $V_{b2}$ is applied to the gates of the pnp-type transistors $M_1$ and $M_2$ and the low voltage differential signal inputs $V_{in1}$ and $V_{in2}$ are applied to the gates of the npn-type transistors $M_3$ and $M_4$, the transistors operate at a saturation area so that amplified electric currents flows from a power supply voltage terminal $V_{DD}$ to a ground terminal $V_{SS}$ and a plurality of differential amplified signals are output to the main driver 120 through the plurality of output terminals $V_{out1}$ and $V_{out2}$ respectively connected to the drains of the pnp-type transistors $M_1$ and $M_2$ and the npn-type transistors $M_3$ and $M_4$.

Meanwhile, according to another aspect of the present invention, the pre-driver 110 may further include a plurality of active loads 112. The plurality of active loads 112 are connected to the DC bias voltage terminal $V_{b2}$ and each of the gates of the pnp-type transistors $M_1$ and $M_2$ of the cascode amplifiers $CA_1$ and $CA_2$, so that currents which are not sensitive to a change of an operating point are applied to each of the gates of the pnp-type transistors $M_1$ and $M_2$. For example, one of the active loads 112 may be a resistor $R_{L1}$.

If the resistor $R_{L1}$ with a very high resistance value is used as one of the active loads 112, the sensitivity of the electric current applied to the gates of the pnp-type transistors $M_1$ and $M_2$ of the first differential amplifying unit 111 can be decreased so that a differential amplification operation which is strong to the change of the operating point may be obtained.

Meanwhile, according to another aspect of the invention, the pre-driver 110 may further include a gain controller 113. The gain controller 113 is commonly connected between the ground terminal $V_{SS}$ and the sources of the npn-type transistors $M_3$ and $M_4$ of a plurality of the cascode amplifiers $CA_1$ and $CA_2$ so that a common mode voltage gain becomes 0 by making output resistance to be infinite.

For example, the gain controller 113 may be prepared to be an npn-type transistor $M_5$ of which a drain is commonly connected to sources of the npn-type transistors $M_3$ and $M_4$ of the cascode amplifiers $CA_1$ and $CA_2$, and a source is connected to the ground terminal $V_{SS}$, and a gate is connected to connected to a DC bias voltage terminal $V_{b1}$.

That is, an output range of a differential signal output from the pre-driver 110 is determined by the DC bias voltage $V_{b2}$ applied to the gates of the pnp-type transistors $M_1$ and $M_2$ and by the low voltage differential signal inputs $V_{in1}$ and $V_{in2}$ respectively applied to the gates of the npn-type transistors $M_3$ and $M_4$, and a frequency gain of the pre-driver 110 is adjusted by the DC bias voltage $V_{b1}$ applied to the gate of the npn-type transistor $M_5$ so that the differential amplification output with a gain and a bandwidth increased can be performed.

Figure 4:
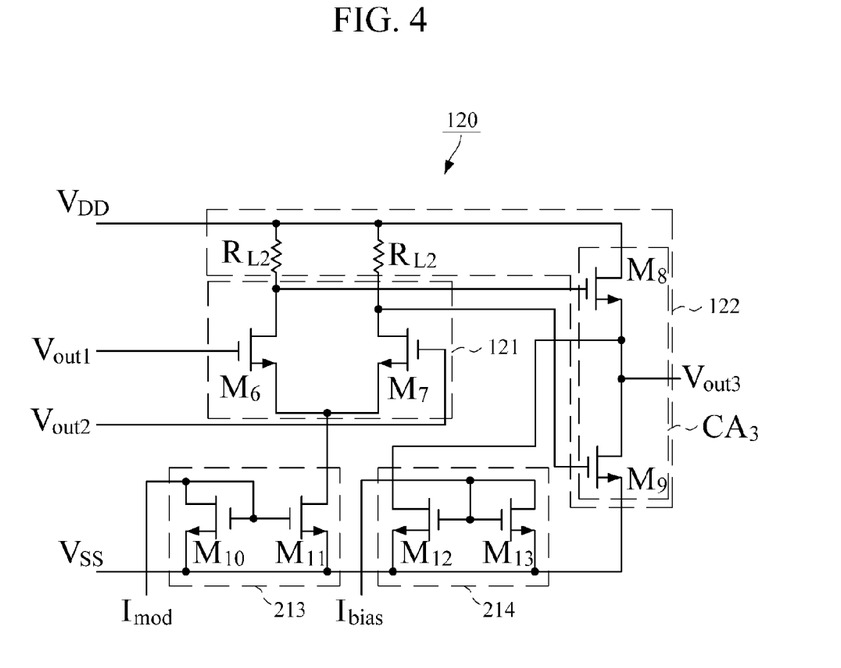
FIG. 4 is a diagram illustrating a circuit of a configuration of a main driver of a laser diode driving apparatus for optical communication according to an embodiment of the present invention.

FIG. 4 is a diagram illustrating a circuit of a configuration of a main driver of a laser diode driving apparatus for optical communication according to an embodiment of the present invention. As illustrated in FIG. 4, the main driver 120 according to an embodiment of the present invention includes a second differential amplifying unit 121 and an output controller 122.

The second differential amplifying unit 121 includes a plurality of npn-type transistors $M_6$ and $M_7$, of which drains are connected to the power supply voltage terminal $V_{DD}$ through a plurality of active loads of resistors $R_{L2}$, sources are commonly connected to the ground terminal $V_{SS}$, and gates are respectively connected to the plurality of output terminals $V_{out1}$ and $V_{out2}$ of the pre-driver 110, and the npn-type transistors $M_6$ and $M_7$ output a plurality of differential amplified signals between the drains and the resistors $R_{L2}$.

The output controller 122 includes a cascode amplifier $CA_3$ that has two npn-type transistors $M_8$ and $M_9$, in which a drain of the npn-type transistor $M_8$ is connected to the power supply voltage terminal $V_{DD}$, a source of the npn-type transistor $M_9$ is connected to the ground terminal $V_{SS}$, a source of the npn-type transistor $M_8$ and a drain of the npn-type transistor $M_9$ are commonly connected to a single output terminal $V_{out3}$, and a plurality of differential amplified signals output from the second differential amplifying unit 121 are applied to the gates of the two npn-type transistor $M_8$ and $M_9$.

If the differential amplified signals output from the pre-driver 110 are applied to the gates of the npn-type transistors $M_6$ and $M_7$ of the second differential amplifying unit 121, the transistors operate in the saturation area, amplified electric currents flow from the power supply voltage terminal $V_{DD}$ to the ground terminal $V_{SS}$, and a plurality of differential amplified signals are output from the drains of the npn-type transistors $M_6$ and $M_7$ and the resistors $R_{L2}$.

The differential amplified signals output between the drains of the npn-type transistors $M_6$ and $M_7$ and the resistors $R_{L2}$ are applied to the gates of the plurality of npn-type transistors $M_8$ and $M_9$ included in the cascode amplifier $CA_3$ of the output controller 122, the transistors operate in the saturation area, the amplified electric currents flow from the power supply voltage terminal $V_{DD}$ to the ground terminal $V_{SS}$, and signals of which gains and bandwidths are improved is output to the laser diode 200 through a single output terminal $V_{out3}$ commonly connected to the source of the npn-type transistor $M_8$ and the drain of the npn-type transistor $M_9$.

Meanwhile, according to another aspect of the present invention, the main driver 120 may further include a compensation controller 123. The compensation controller 123 automatically controls and compensates for changes by the temperature-dependent characteristics of currents output through the single output terminal $V_{out3}$ to a laser diode 200.

For example, the compensation controller 123 may be prepared to include a plurality of npn-type transistors $M_{10}$ and $M_{11}$, in which gates of the plurality of npn-type transistors $M_{10}$ and $M_{11}$ are commonly connected to a modulated current terminal $I_{mod}$, sources of the plurality of npn-type transistors $M_{10}$ and $M_{11}$ are connected to the ground terminal $V_{SS}$, a drain of the npn-type transistor $M_{10}$ is connected to the modulated current terminal $I_{mod}$, and a drain of the npn-type transistor $M_{11}$ is commonly connected to the sources of the plurality of npn-type transistors $M_6$ and $M_7$ of the second differential amplifying unit.

Meanwhile, according to another aspect of the present invention, the main driver 120 may further include a power controller 124. The power controller 124 configures a range of an output voltage output through the single output terminal $V_{out3}$ to the laser diode 200.

For example, the power controller 124 may be prepared to include a plurality of npn-type transistors $M_{12}$ and $M_{13}$, in which gates of the plurality of npn-type transistors $M_{12}$ and $M_{13}$ are commonly connected to the bias current terminal $I_{bias}$, sources of the plurality of npn-type transistors $M_{12}$ and $M_{13}$ are connected to the ground terminal $V_{SS}$, a drain of the npn-type transistor $M_{12}$ is connected between a source of the npn-type transistor $M_8$ of the cascode amplifier $CA_3$ and the output terminal $V_{out3}$, and a drain of the npn-type transistor $M_{13}$ is connected to the bias current terminal $I_{bias}$.

Since the optical power of the laser diode 200 changes according to characteristics of an electric current input to the laser diode 200 (decreases according to time and temperature), the main driver 120 should maintain an average transmission optical power and the extinction ratio by controlling the modulated current and the bias current (current mirror). The main driver 120 controls a modulated current $I_{mod}$ through the compensation controller 123, and controls the bias current $I_{bias}$ through the power controller 124.

Sizes of transistors of the pre-driver 110 and the main driver 120 included in the laser diode driving apparatus 100 for optical transmission should be selected so as to reduce parasitic capacitance in output so as to secure sufficient driving current flows and bandwidths. Here, the average driving current of the laser diode 200 by the laser diode driving apparatus 100 for optical transmission is (modulated current $I_{mod}$+bias current $I_{bias}$)/2.

If the differential amplifier uses a resistor R as an active load for differential signal transmission, transistors that function as current mirrors and loads should operate in a normal saturation area so that the circuit operates normally.

The voltage gain A of the differential amplifier may be expressed as the equation below.

$$A = V_o/V_i = g_m R$$

Here, $g_m$ is a conductance, and R is an active load.

The transistors form negative feedback and increase output resistance. However, since the values are limited, the voltage gain is limited a little bit. Therefore, in order to compensate for the limitation, a cascode amplification structure is employed in the present invention.

Figure 5:
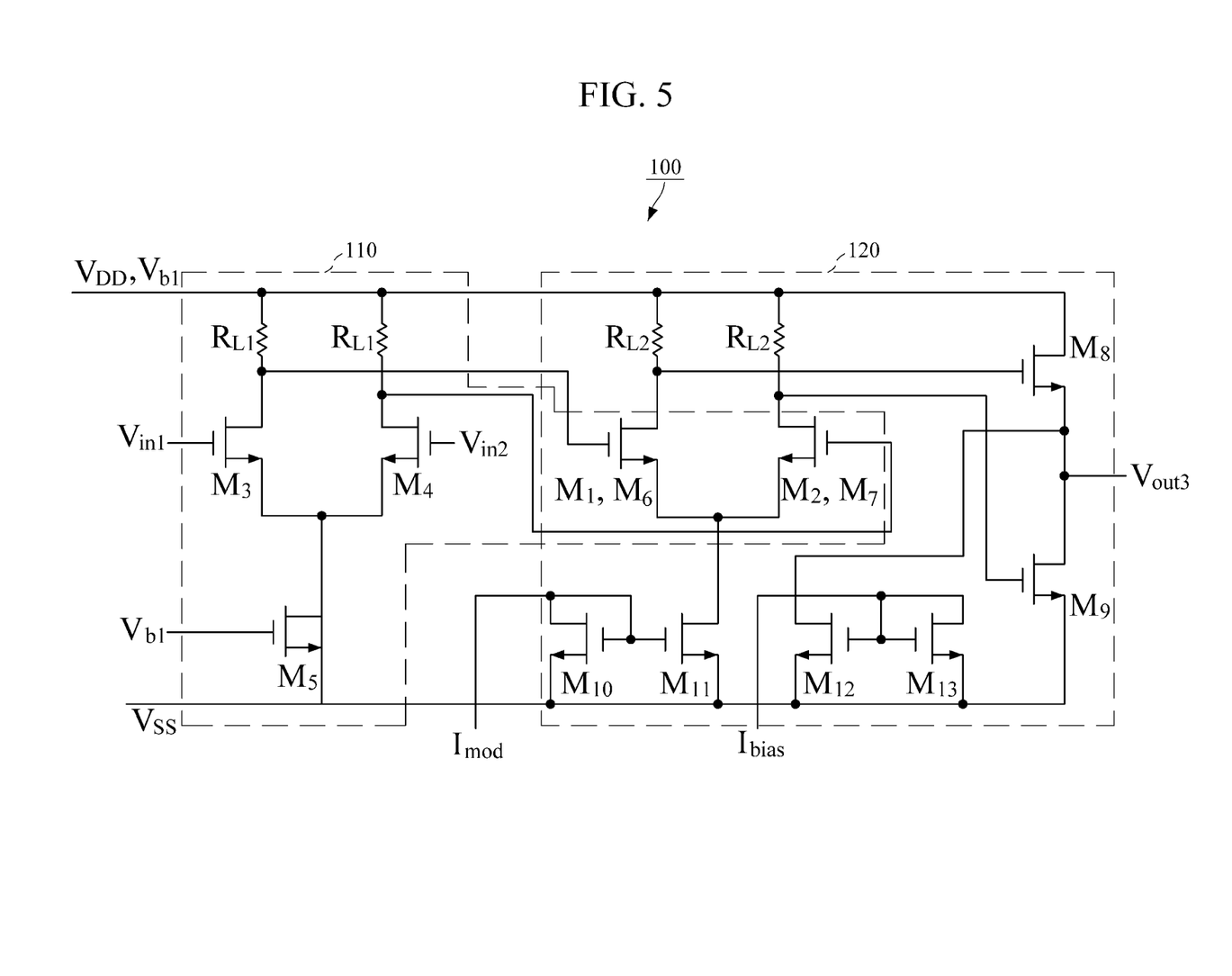
FIG. 5 is a diagram illustrating a circuit of a whole configuration of a laser diode driving apparatus for optical communication according to an embodiment of the present invention.

FIG. 5 is a diagram illustrating a circuit of a whole configuration of a laser diode driving apparatus for optical communication according to an embodiment of the present invention. The laser diode driving apparatus for optical transmission is prepared commonly using the transistors $M_3$ and $M_4$ of the first differential amplifying unit 111 of the pre-driver 110 and the transistors $M_6$ and $M_7$ of the first differential amplifying unit 111 of the main driver 120, and the employed cascode amplifiers $CA_1$, $CA_2$, and $CA_3$ use a plurality of transistors connected in series so as to greatly increase the output resistance and the voltage gain. Since the transistors of the cascode amplifiers $CA_1$, $CA_2$, and $CA_3$ do not have currents flowing through the gates, if the multiple transistors are connected in series, though the range of the output values in a saturation area is limited, a desired output resistance may be obtained.

In the cascode amplifiers $CA_1$, $CA_2$, and $CA_3$ employed in the pre-driver 110 and the main driver 120, since the active loads $R_{L1}$ and $R_{L2}$ with high resistance are connected to the gates in series and the output terminal has only one pole, oscillation is not needed to be considered to obtain a high DC voltage gain and it is appropriate for high speed applications. If the conductance $g_m$ is increased, the linear operation range decreases, but a gain is improved to a proper value. The entire voltage gain of the main driver 120 is obtained by adding the voltage gain of the second differential amplifying unit 121 and the gain of the cascode amplifier $CA_3$.

Figure 6:
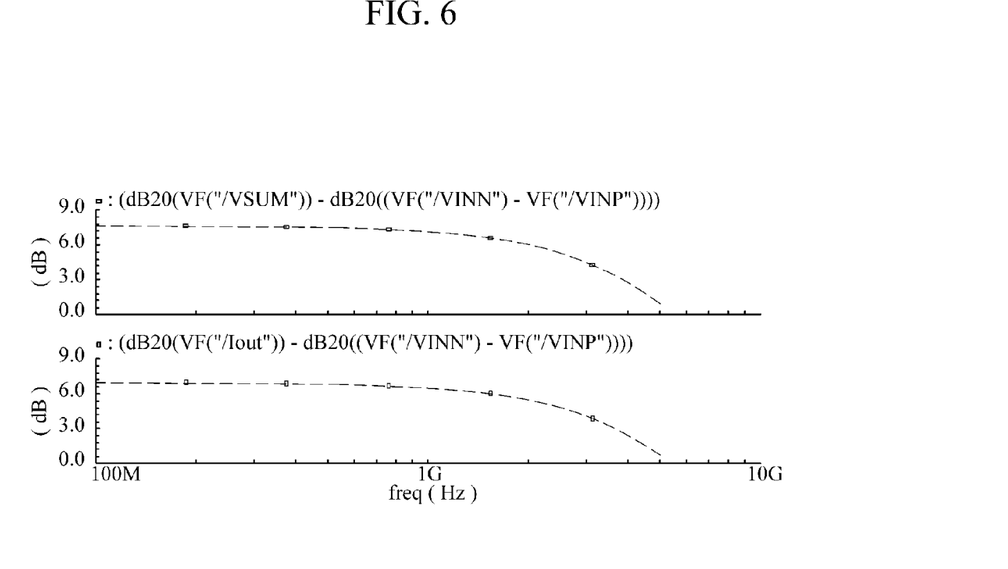
FIG. 6 is graphs of relations between an input voltage and an output voltage of a laser diode driving apparatus for optical communication according to the present invention.

FIG. 6 is a diagram illustrating graphs relations between an input voltage and an output voltage of a laser diode driving apparatus for optical communication according to the present invention. The upper graph in FIG. 6 presents voltage response characteristics between an input and an output of the laser diode driving apparatus for optical transmission according to an embodiment of the present invention, and the lower graph presents that after passing through a signal combined circuit (not shown) in which the modulated current $I_{mod}$ and the bias current $I_{bias}$ are combined, the output signal of the laser diode driving apparatus for optical communication matches with the input signal of the laser diode driving apparatus for optical communication according to an embodiment of the present invention in a circuit condition in which an equivalent circuit (not illustrated) of the optical communication laser diode is connected and presents that the circuit normally operates at 5 Gb/s.

Figure 7:
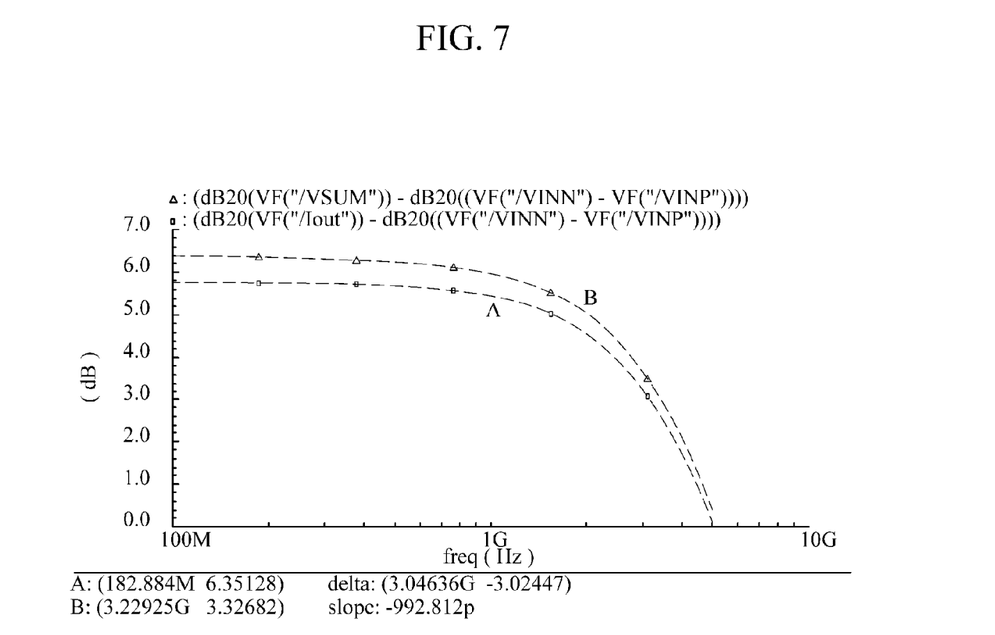
FIG. 7 is a graph of characteristics of a frequency and a gain of a laser diode driving apparatus for optical communication according to the present invention.

FIG. 7 is a diagram illustrating a graph of characteristics of a frequency and a gain of a laser diode driving apparatus for optical communication according to the present invention. The lower curve in FIG. 7 presents that a frequency bandwidth and a voltage gain of the laser diode driving apparatus for optical communication according to the present invention have 3.3G and 2.7 dB, and the upper curve in FIG. 7 is a simulation of a result in which $I_{bias}+I_{mod}$ signals are synthesized in a circuit condition in which an equivalent circuit (not illustrated) of the optical communication laser diode is connected.

Figure 8:
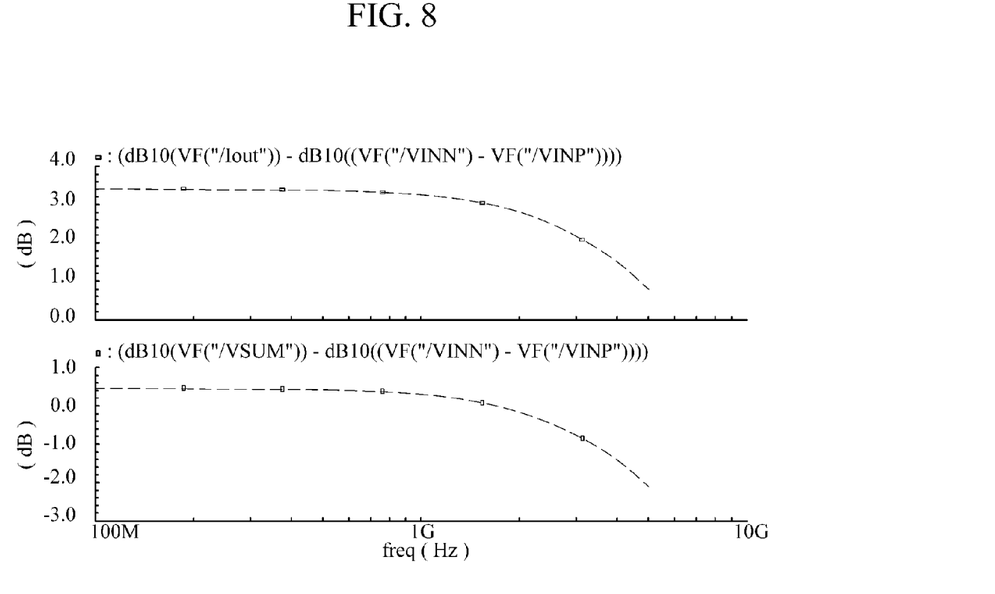
FIG. 8 is graphs illustrating characteristics of a voltage gain of a laser diode driving apparatus for optical communication according to the present invention.

FIG. 8 is a graph illustrating characteristics of a voltage gain of a laser diode driving apparatus for optical communication according to the present invention. As illustrated in FIG. 8, the characteristics of the voltage gain of the laser diode driving apparatus for optical communication according to the present invention presents the similar result with the characteristics of the frequency and the voltage gain illustrated in FIG. 7.

Figure 9:
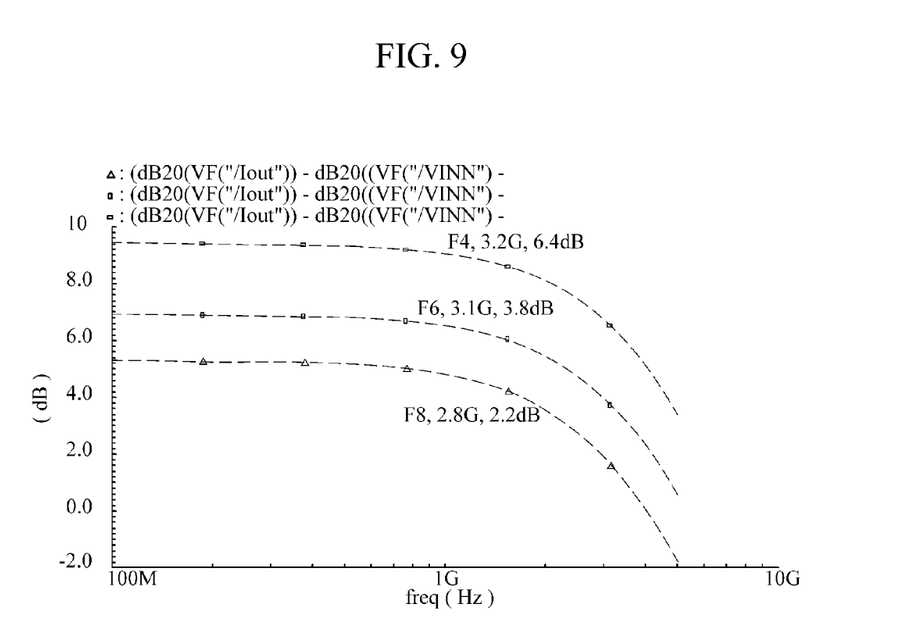
FIG. 9 is a graph illustrating a correlation between bandwidths and gains of a laser diode driving apparatus for optical communication according to an embodiment of the present invention.

FIG. 9 is a graph illustrating a correlation between bandwidths and gains of a laser diode driving apparatus for optical communication according to an embodiment of the present invention. It is considered that a laser diode driving apparatus for optical communication using 0.8 um of CMOS can be designed in 5 G in general. When a simulation is performed by changing the design values of W/L of the CMOS FET of the differential amplifier to W/L4, W/L6, and W/L8, respectively, and results to a curve of the bandwidths and the gains are observed, the bandwidths and the gains have 3.2G, 6.4 dB, 3.1G, 3.8 dB, and 2.8G, 2.2 dB as illustrated in FIG. 9. That is, according to the CMOS W/L values, the frequency bandwidths and the gains sensitively change form 2.8 G to 3.2 G, and from 6.4G to 2.2G, respectively.

Figure 10:
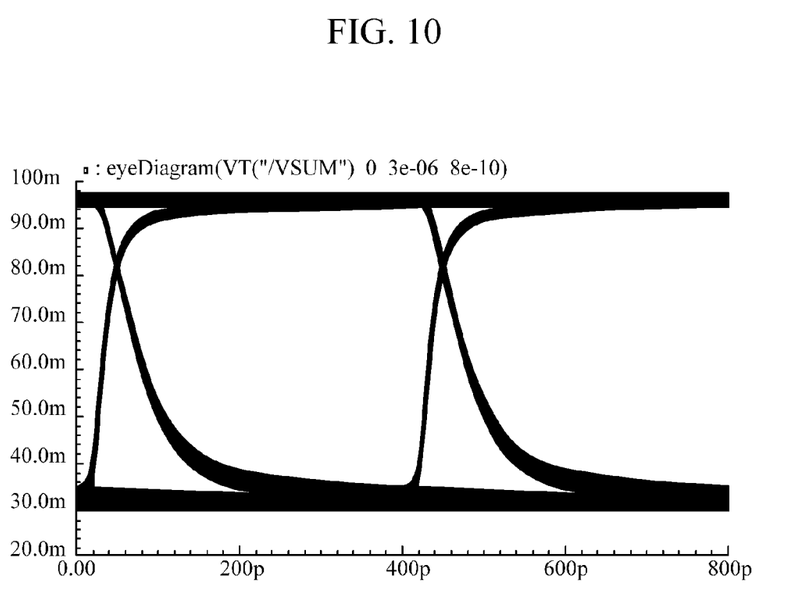
FIG. 10 is an eye diagram for performance confirmation of a laser diode driving apparatus for optical communication according to an embodiment of the present invention.

FIG. 10 is an eye diagram for performance confirmation of a laser diode driving apparatus for optical communication according to an embodiment of the present invention. The eye diagram is a result of a measurement in 30 to 100 m for 800 ps during 2 cycles.

As illustrated above, according to the present invention, a low-price and low-power optical transmission and reception apparatus can be prepared by realizing a high performance laser diode driving apparatus for optical communication with a structure appropriate for a multichannel array that can easily and effectively provide stable bandwidths and high gains of the optical communication laser diode at a transmission end of the optical transmission and reception apparatus. Thus, the purpose of the present invention can be achieved.

The present invention has been described according to exemplary embodiments with reference to the accompanying drawings. However, it is obvious that various changes in form and detail may be made therein without departing from the scope of the present invention as defined by the appended claims.

What is claimed is:

1. A laser diode driving apparatus for optical communication, comprising:
a pre-driver; and
a main driver,
wherein the pre-driver includes a first differential amplifying unit having a plurality of cascode amplifiers $CA_1$ and $CA_2$, in which drains of pnp-type transistors $M_1$ and $M_2$ and npn-type transistors $M_3$ and $M_4$ are commonly connected to a plurality of output terminals $V_{out1}$ and $V_{out2}$, sources of the pnp-type transistors $M_1$ and $M_2$ are connected to a power supply voltage terminal $V_{DD}$, sources of the npn-type transistors $M_3$ and $M_4$ are commonly connected to a ground terminal $V_{SS}$, gates of the pnp-type transistors $M_1$ and $M_2$ are connected to a DC bias voltage terminal $V_{b2}$, gates of the npn-type transistors $M_3$ and $M_4$ are respectively connected to a plurality of low voltage differential signal input terminals $V_{in1}$ and $V_{in2}$, and a plurality of differential amplified signals are output to the main driver.

2. The laser diode driving apparatus of claim 1, wherein the pre-driver further includes a plurality of active loads respectively connected between the gates of the pnp-type transistors $M_1$ and $M_2$ of the cascode amplifiers $CA_1$ and $CA_2$ and the DC bias voltage terminal $V_{b2}$, and configured to apply currents insensitive to operating point changes to the gates of the pnp-type transistors $M_1$ and $M_2$.

3. The laser diode driving apparatus of claim 2, wherein the active loads are resistors $R_{L1}$.

4. The laser diode driving apparatus of claim 1, wherein the pre-driver further includes a gain controller commonly connected to between the sources of the npn-type transistors $M_3$ and $M_4$ of the plurality of cascode amplifiers $CA_1$ and $CA_2$ and the ground terminal $V_{SS}$ so that a common mode voltage gain becomes 0 by making output resistance to be infinite.

5. The laser diode driving apparatus of claim 4, wherein the gain controller is provided with an npn-type transistor $M_5$ in which a drain is commonly connected to sources of the npn-type transistors $M_3$ and $M_4$ of the plurality of cascode amplifiers $CA_1$ and $CA_2$, a source is connected to the ground terminal $V_{SS}$, and a gate is connected to a DC bias voltage terminal $V_{b1}$.

6. The laser diode driving apparatus of claim 1, wherein the main driver further includes:

a second differential amplifying unit including a plurality of npn-type transistors $M_6$ and $M_7$ in which drains are respectively connected to the power supply voltage terminal $V_{DD}$ through a plurality of resistors $R_{L2}$, sources are commonly connected to the ground terminal $V_{SS}$, gates are respectively connected to the plurality of output terminals $V_{out1}$ and $V_{out2}$ of the pre-driver, and a plurality of differential amplified signals are output between the drains and the resistors $R_{L2}$; and
an output controller including a cascode amplifier $CA_3$ having two npn-type transistor $M_8$ and $M_9$, in which a drain of the npn-type transistor $M_8$ is connected to the power supply voltage terminal $V_{DD}$, a source of the npn-type transistor $M_9$ is connected to the ground terminal $V_{SS}$, a source of the npn-type transistor $M_8$ and a drain of the npn-type transistor $M_9$ are commonly connected to a single output terminal $V_{out3}$, and a plurality of differential amplified signals output from the second differential amplifying unit are applied to gates of the two npn-type transistors $M_8$ and $M_9$.

7. The laser diode driving apparatus of claim 6, wherein the main driver further includes a compensation controller configured to automatically control and compensate for changes by temperature-dependent characteristics of currents output to a laser diode through the single output terminal $V_{out3}$.

8. The laser diode driving apparatus of claim 7, wherein the compensation controller includes a plurality of npn-type transistors $M_{10}$ and $M_{11}$, in which gates of the plurality of npn-type transistors $M_{10}$ and $M_{11}$ are commonly connected to a modulated current terminal $I_{mod}$, sources of the plurality of npn-type transistor $M_{10}$ and $M_{11}$ are respectively connected to the ground terminal $V_{SS}$, a drain of the npn-type transistor $M_{10}$ is connected to the modulated current terminal $I_{mod}$, a drain of the npn-type transistor $M_{11}$ is commonly connected to the sources of the plurality of npn-type transistor $M_6$ and $M_7$ of the second differential amplifying unit.

9. The laser diode driving apparatus of claim 6, wherein the main driver further includes a power controller configured to set a range of an output voltage output to the laser diode through the single output terminal $V_{out3}$.

10. The laser diode driving apparatus of claim 9, wherein the power controller includes a plurality of npn-type transistors $M_{12}$ and $M_{13}$, in which gates of the plurality of npn-type transistors $M_{12}$ and $M_{13}$ are commonly connected to the bias current terminal $I_{bias}$, sources of the plurality of npn-type transistors $M_{12}$ and $M_{13}$ each are connected to the ground terminal $V_{SS}$, a drain of the npn-type transistor $M_{12}$ is connected between the source of the npn-type transistor $M_8$ of the cascode amplifier $CA_3$ and the single output terminal $V_{out3}$, and a drain of the other npn-type transistor $M_{13}$ is connected to the bias current terminal $I_{bias}$.

* * * * *